United States Patent [19]
Bergman

[11] Patent Number: 5,332,445
[45] Date of Patent: Jul. 26, 1994

[54] AQUEOUS HYDROFLUORIC ACID VAPOR PROCESSING OF SEMICONDUCTOR WAFERS

[75] Inventor: Eric J. Bergman, Kalispell, Mont.

[73] Assignee: Semitool, Inc., Kalispell, Mont.

[21] Appl. No.: 954,976

[22] Filed: Sep. 30, 1992

Related U.S. Application Data

[63] Continuation of Ser. No. 526,052, May 21, 1990, abandoned, which is a continuation-in-part of Ser. No. 524,239, May 15, 1990.

[51] Int. Cl.$^5$ .......................................... H01L 21/306
[52] U.S. Cl. .......................................... 134/3; 134/31; 156/639; 156/646
[58] Field of Search .................. 156/638, 639, 640, 642, 156/646; 134/3, 31

[56] References Cited

U.S. PATENT DOCUMENTS

| | | | |
|---|---|---|---|
| 5,044,314 | 9/1991 | McNeilly | 156/646 |
| 5,078,832 | 1/1992 | Tanaka | 134/3 |
| 5,169,408 | 12/1992 | Biggerstaff et al. | 29/25.01 |
| 5,174,855 | 12/1992 | Tanaka | 134/31 |
| 5,248,380 | 9/1993 | Tanaka | 156/626 |

FOREIGN PATENT DOCUMENTS

| | | |
|---|---|---|
| 58-19475 | 2/1983 | Japan . |
| 59-166675 | 9/1984 | Japan .................. 156/646 |
| 61-148820 | 7/1986 | Japan .................. 156/646 |

OTHER PUBLICATIONS

Beyer et al., "Etching of SiO$_2$ in Gaseous HF/H$_2$O", IBM Technical Disclosure Bulletin, vol. 19, No. 7, Dec. 1976, p. 2513.

*Primary Examiner*—Olik Chaudhuri
*Assistant Examiner*—Ourmazd S. Ojan
*Attorney, Agent, or Firm*—Wells, St. John, Roberts, Gregory & Matkin

[57] ABSTRACT

Disclosed are methods and apparatuses for improved etching of semiconductor wafers and the like using hydrofluoric acid (HF) and water mixtures or solutions which generate equilibrium vapor mixtures of HF vapor and water vapor which serve as a homogenous etchant gas. The vapor etchants do not employ a carrier gas which will make the vapors nonhomogeneous and reduce etching rates. The vapors are preferably generated from a liquid source which is provided within a contained reaction chamber which holds the wafer. The wafer is preferably oriented with the surface being processed directed downward. The wafer is advantageously positioned above or in close proximity to the equilibrium liquid source of the vapor. The wafer is rotated at a rotational speed in the range of 20–1000 revolutions per minute to provide uniform dispersion of the homogeneous etchant gas across the wafer surface and to facilitate circulation and transfer from the liquid source into etchant gas and onto the processed surface. The liquid source of the vapor can advantageously be provided in a bath immediately below the processed surface of the wafer or in a toroidal basin adjacent to the wafer. The processes provide high speed etching of good uniformity and superior particle count performance.

72 Claims, 1 Drawing Sheet

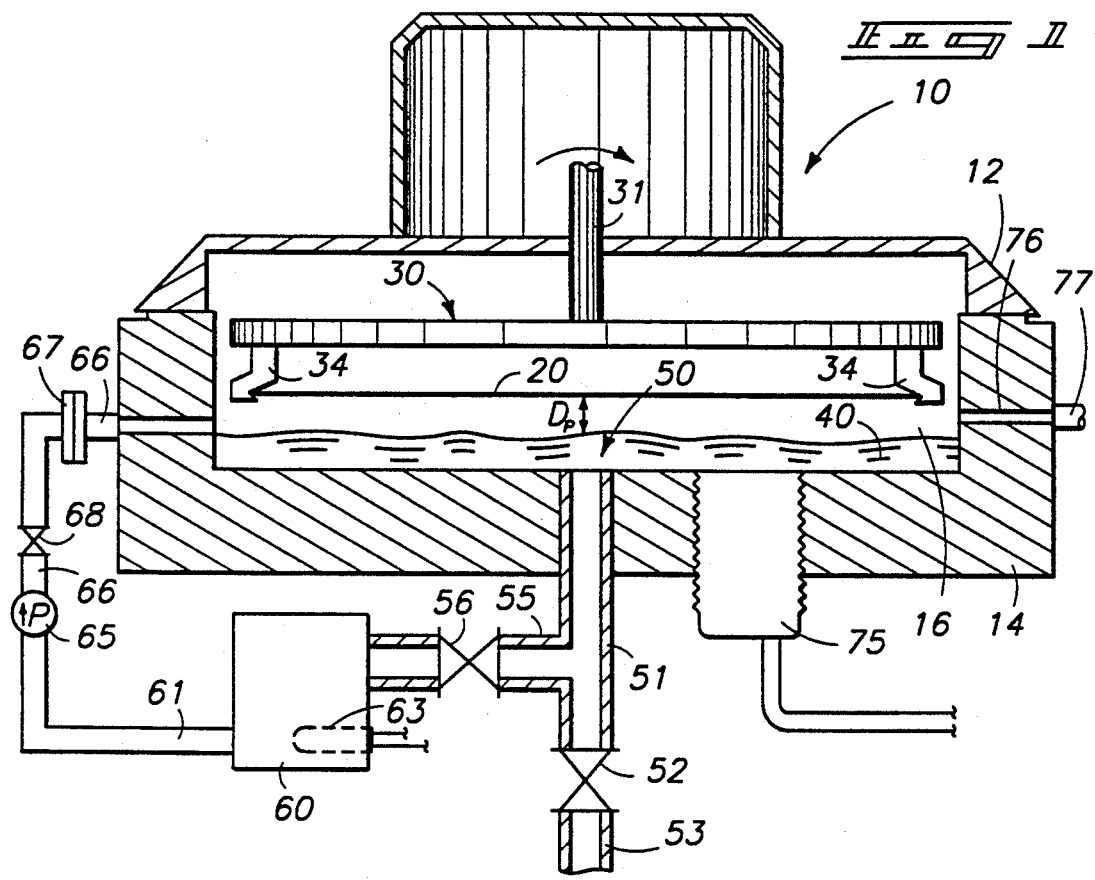
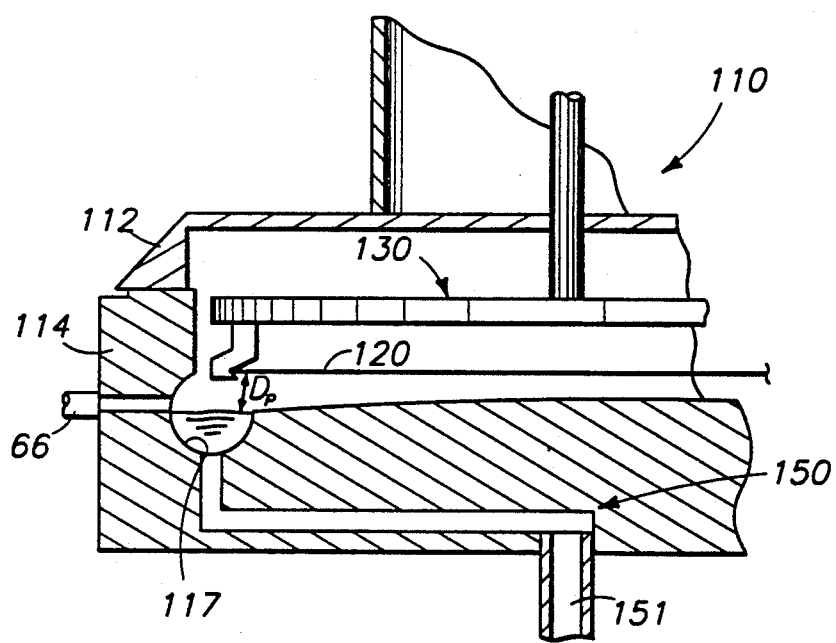

AQUEOUS HYDROFLUORIC ACID VAPOR PROCESSING OF SEMICONDUCTOR WAFERS

CROSS-REFERENCE TO RELATED APPLICATION

This is a continuation of U.S. patent application Ser. No. 07/526,052, filed May 21, 1990; now abandoned which is a continuation-in-part of U.S. patent application Ser. No. 07/524,239, filed May 15, 1990, entitled "Aqueous Hydrofluoric Acid Vapor Etching of Semiconductor Wafers".

TECHNICAL FIELD

The technical field of this invention is vapor phase etching processes for silicon and other semiconductor wafers using hydrofluoric acid aqueous solutions.

BACKGROUND OF THE INVENTION

It is common in the processing of silicon wafers to remove or etch portions of a layer of silicon dioxide using an etchant. The common etchant is hydrofluoric acid. This is typically done using an immersion process wherein a wafer, or one or more carriers containing a number of wafers, is immersed in the desired hydrofluoric acid containing processing fluid.

One of the disadvantages of immersion etching processes is that the wafers typically exhibit an increase in the numbers of particulates which become adhered to or imbedded in the wafer. As the feature size of semiconductor wafers continues to decrease into the submicron sizes, now typically in the range of 0.1-0.5 micron, the need for minimizing contamination becomes more acute. These small feature sizes also create additional problems for immersion processing because surface tension effects can reduce etching uniformity and resulting product quality.

It has previously been recognized that silicon wafers can be processed by using etchant gases, including gases which contain hydrofluoric acid (HF). In an article entitled, "Etching of Thin $SiO_2$ Layers Using Wet HF Gas" authors P. A. M. van der Heide et al., describe the etching of silicon dioxide layers by using vapor mixtures of HF, water and nitrogen. The article describes using a flow of nitrogen carrier gas through a vessel containing a 10% hydrofluoric aqueous solution. The nitrogen carrier produced a flow of etchant gas which was directed through a nozzle against the surface of a small silicon wafer being etched. A flow of dry nitrogen was passed over the opposite side of the wafer to reduce the effects of ambient atmospheric water which was present in the essentially open atmospheric process. Temperatures from 25°-40° C. were indicated for the HF solution and from 25° C. to about 60° C. for the wafer. The authors also reported that high temperature treatment under vacuum conditions following the etch provided complete removal of oxygen.

One deficiency of the process described is the continuation of etching after the process exposure has begun. This results in uneven etching rates and problems in the resulting integrated circuit devices due to variations in feature sizes across the device. The etching uniformity is also deficient in that the process arrangement may not provide assurance of equilibrium homogeneous presentation of the reactant gas to the wafer being processed. Variations in the uptake of the vapors by the incoming carrier gas stream can result in instantaneous variations in the etchant gas stream which can affect processing.

This deficiency may not have been as significant in the reported processing because of the substantial diluting effect of the carrier gas which also resulted in very slow etching rates.

Another serious deficiency of the processing described by van der Heidi is that the etching rates are very slow and accordingly not practical from a commercial processing standpoint where high volume production rates must be maintained. The authors describe the need to produce an initial wetting time and then periods of 3.5-5 minutes were reported as acceptable for removing very thin layers of only 1.2-3.5 nanometers. The resulting indicated etching rates were about 1 minute per nanometer (1 minute per 10 Angstroms). These relatively slow etching rates would provide commercially unfeasible processing times of 5-100 minutes where layers of 50-1000 Angstroms are to be removed. Such processing times are sufficiently slow to prevent acceptance of the van der Heide vapor processing as a substitute to the faster processing times possible using the prevalent immersion processing.

U.S. Pat. No. 4,749,440 to Blackwood et al. shows a gaseous process for removing films from substrates which utilizes an anhydrous HF supply. The process is described to involve passing a flow of dry nitrogen over the wafer and then introducing a flow of reactive gas which is preferably an anhydrous hydrogen halide gas such as anhydrous hydrogen fluoride gas. A flow of water vapor laden nitrogen is also passed over the wafer before the anhydrous HF gas flow is begun and this is continued until after the anhydrous HF gas flow has been stopped. This type of processing leads to nonhomogeneous mixing occurring during the brief processing period of approximately 5-30 seconds. During the initial period exclusively water laden carrier gas is first introduced. This subjects the surface of the wafer to a high gradient moisture increase over a very short period of time. This is immediately followed by anhydrous HF gas which is incapable of reaching any effectively uniform or equilibrium condition with the water vapor because of the prior introduction of the water vapor and the quickly terminated introduction of the HF which creates a highly reactive combination varying from point to point across the wafer surface. The resulting highly reactive but nonhomogeneous etchant gas is capable of high etch rates. Unfortunately, the results using this process have proven to be highly variable with nonuniform etching on the same device being a common problem as well as nonuniformity from one device to the next. Acceptance of this processing system was initially enthusiastic but has been nearly abandoned by chip manufacturers because of the seriousness of the nonuniformity problem in etching rates.

The nonuniformity problem also results from variations in the amount of water present in the matrix of the material being processed which can have very significant effects on the effective localized HF-water concentrations on the surface of the chip during the high speed etching reaction which occurs during this type of processing. Wafers otherwise processed in a similar manner may exhibit highly differing etch rates merely because they have been allowed to sit for hours under ambient conditions thereby uptaking atmospheric moisture to a substantially greater degree than other wafers processed soon out of a furnace or other moisture eliminating processing. Such variations in moisture content of the wafers are typical and any special preatmospheric treatment necessarily increases processing time, processing logistics, or both.

Another more recent approach to vapor etching of wafers using HF is incorporated into the processing machine referred to as the EDGE 2000 from Advantage Production Technology. This system utilizes a specially configured processing chamber which vacuum treats the wafer prior to processing with the etchant. This approach attempts to remove residual moisture from the wafer to address the nonuniform etching rate problem discussed above. The relatively short duration vacuum processing cannot remove all moisture content variations. The wafer is exposed to a highly reactive HF-water gas stream which is directed at the wafer in a vertical orientation from one or both sides. The jet of incoming reactant gas impinges upon the surface or surfaces of the wafer at localized central areas and typically results in non-uniformities in mass transfer due to this localized impingement despite the vacuum processing directed toward water removal.

Thus there remains a strong need in the art for gaseous HF processing which will provide uniform and repeatable results with high effective etching rates while achieving low contamination and particle counts. Other objectives and advantages of the invention are also indicated herein.

BRIEF DESCRIPTION OF THE DRAWINGS

Preferred embodiments of the invention are illustrated in the accompanying drawings, which are briefly described below.

FIG. 1 is a schematic side sectional view showing a preferred configuration for vapor processing wafers according to this invention.

FIG. 2 is a further schematic side sectional view showing another preferred configuration for vapor processing wafers according to this invention.

DETAILED DESCRIPTION OF THE PREFERRED EMBODIMENTS

This disclosure of the invention is submitted to furtherance of the constitutional purposes of the Patent Laws "to promote the progress of science and useful arts" (Article 1, Section 8).

The novel processes according to this invention involve the production of a vapor mixture or solution which is used as an etching gas. The etchant used in the process is an acid, preferably a hydrogen-halide acid, most preferably hydrogen fluoride. The etching vapor mixture preferably includes hydrofluoric acid vapor and water vapor. The water vapor acts as a dliuent and is important in inducing the reactivity of the hydrofluoric acid.

The manner of producing and presenting the vapor mixture to the semiconductor wafer or similar article being etched is of great significance in the achievement of a commercially viable process of suitable benefits to warrant use in the semiconductor chip manufacturing industry. The vapor mixture is preferably produced in a manner which generates a nearly homogeneous vapor mixture of these constituents which acts as a reactant etchant gas. The vapor mixture is most preferably in equilibrium with a liquid phase supplying the vapors. The liquid phase source is also preferably homogeneously mixed or in solution.

The typical utilization of the processes is in the removal of oxide and nitride layers, such as silicon dioxide layers from silicon wafers. The processes are also potentially applicable to the processing of other wafer and substrate materials, such as gallium arsenide and indium containing semiconductors.

The etchant gas is preferably produced from a homogeneous liquid mixture or solution of hydrofluoric acid and water which forms a source for the homogeneous equilibrium vapor etchant. Alternative etchant and diluent sources may alternatively be possible. The equilibrium liquid etchant source is advantageously comprised of hydrofluoric acid and water in sufficient amounts to provide relative molar concentrations in the approximate range of 1:100 to 1:1 (hydrofluoric acid:water). More preferably, the liquid source of the etchant vapor includes amounts sufficient to provide relative molar concentrations in the approximate range of 1:50 to 1:5 (hydrofluoric acid:water).

The hydrofluoric acid and water used in preparing the liquid processing fluid or etchant source are preferably of very high purity without contaminating particles of organic or inorganic materials. Purity levels of the highest or nearly highest degree obtainable with chemical purification techniques now available are most appropriate.

The processing liquid mixture is advantageously maintained at a temperature suitable for producing vapor pressures of the constituents which cause good evolution of vapor to speed processing. Liquid processing fluid temperatures in the range of 10°–100° C. are appropriate. Temperatures in the range of 20°–40° C. are more preferred, with ambient temperatures of 20°–25° C. most typical.

The vapor processing is preferably done within an enclosed or confined processing chamber at pressures which are sufficiently high to prevent boiling of the liquid processing fluid. Processing pressures in the approximate range of 100–2000 torr are operable dependent upon temperature of the liquid mixture. Pressures in the range of 500–1500 torr are more preferable with atmospheric pressures in the range of 600–900 torr most preferable.

The liquid phase processing mixture can advantageously be assisted into vapor formation by a suitable vaporization enhancer. The vaporizing of the liquid phase can be enhanced by a suitable agitating, such as by circulating through a recycle system as described below, or otherwise agitating the processing liquid. It is alternatively, or additionally possible to use ultrasonic agitation to enhance vapor formation. Enhanced vapor formation can serve to increase processing throughput and availability of the vapor phase mixture to the wafer being processed.

The homogeneous etchant gases used in the novel processes of this invention are preferably presented to a wafer being processed so as to uniformly contact the surface or surfaces being etched or otherwise acid processed. The use of carrier gas is specifically not employed because of the inventor's identification of substantial complicating and derogatory effects of such an approach. Carrier gases tend not only to dilute the vapor and reduce etch rates, but also to represent substantial additional problems in maintaining homogeneity and effective etching upon the surface of the wafer being processed.

The preferred etchant gases are contacted against the processed surface of the wafer in a manner specifically designed to minimize the potential for nonhomogeneity and variations in the microscopic localized concentrations of the hydrofluoric acid and water. The etching rate of aqueous hydrofluoric acid mixtures varies dramatically as a function of differing relative concentrations of these constituents. Such variations have plagued the semiconductor industry resulting in uneven etch rates which are increasingly troublesome in chips having smaller and smaller feature sizes. A preferred manner of presenting the etchant vapors is to generate the vapors from a pool of homogeneous liquid mixture which is in close physical proximity to the wafer surface. This is advantageously accomplished by forming a pool of the liquid source which is maintained in a homogeneous equilibrium condition by suitable mixing. The wafer is then processed by closely positioning the wafer to the source pool.

The preferred manner of presentation of the etchant vapors to the processed wafer surface or surfaces is also to orient the processed surface to face downwardly. This presents the treated surface in a manner which resists particle migration to the surface by the force of gravity. It is also advantageous in bringing the processed surface of the wafer in closer proximity and juxtaposition to the source of vapor and improves the mass transfer between the source and surface to maintain high etch rates. The wafer surface being processed is preferably in the approximate range of 2-100 millimeters from the surface of the liquid etchant source to facilitate circulation and mass transfer.

The novel processes of this invention also include rotating the wafer during the presentation of the vapors to provide uniform dispersion of the etchant gas over the entire processed surface of the wafer. The rotating of the wafer being processed is also significant in creating circulation which provides adequate mass transfer between the source, vapor and surface being treated. At sufficient rotational speeds a vortex action develops which can be significant in providing the desired mass transfer and circulation. These dynamic flows in the circulating etchant vapors also are significant in maintaining homogeneity and equilibrium in the vapor phase so that etch rates are uniform across the wafer and repeatable from wafer to wafer.

The rotating action of the wafer is preferably at rotational speeds of at least 20 revolutions per minute (rpm). Speeds less than 20 rpm have been found inadequate to fulfill the processing needs of the system. More advantageously, the relative wafer rotational speeds are in the approximate range of 20-1000 rpm because excessive speeds have been determined to cause a substantial derogatory effect in particle counts on the wafer. Although the specific mechanism is not known with precision, it is believed that the high rotational speeds cause such extensive turbulence that particles are agitated to a point causing migration onto the wafer surface from either the liquid source or the processing equipment. High rotational speeds may also cause electrical charge (static electricity) to develop which may aggravate the potential, otherwise raised by the turbulence, for particle migration.

Although rotational speeds in the range of 20-1000 rpm are operable, experimentation has indicated that rotational speeds in the range of approximately 30-800 rpm are improved in maintaining low particle counts as compared to rotational speeds outside this range. Still further significant improvement has been shown when the rotational speeds are in the range of approximately 50-400 rpm. Still further preferred are rotational speeds in the approximate range of 50-250 rpm.

The novel processes of this invention further advantageously include drying the wafer after the acid vapor phase processing described above. The vapor processing can lead to condensation of the vapors onto the surface of the wafers. The drying advantageously includes a post-acid-processing spin cycle immediately after the vapor phase processing described above. The wafer is rotated as during the vapor phase processing or with increased rotational speeds greater than 1000 rpm. Spinning speeds in the approximate range 1000-3000 rpm are suitable, with speeds of 1000-2000 most preferred.

The spin processing can be assisted by also passing a flow of suitable drying gas through the processing chamber to further supplement or finalize the drying process. The drying gas is preferably a non-reactive gas, such as nitrogen or an inert gas. The drying gas can be heated or supplied at ambient temperatures. Drying gas having temperatures in the range of 0°-200° C. are appropriate, with temperatures in the range 20°-100° C. more preferred. The drying gas is preferably supplied so as to impinge upon the processed surface or surfaces being dried.

FIG. 1 shows relevant portions of a preferred semiconductor processing machine adapted for carrying out the novel processes of this invention. Processing machine 10 includes a movable head 12 which mates with a processing bowl 14 to confine a processing chamber 16. Processing head 12 includes a suitable wafer holder 30 for holding a wafer 20 using fingers 34 in a desired orientation with the processed surface facing downwardly. The wafer holder 30 is provided with a motor or other drive (not shown) which is connected to the drive shaft 31 to rotate the wafer in the desired rotational processing described above.

The arrangement shown in FIG. 1 includes the wafer 20 in superposition above a subjacent pool 40 of the liquid source for the gaseous etchant. The proximity distance $D_P$ defines the amount of separation between the upper level of the liquid etchant source and the wafer surface being processed. The preferred range of $D_P$ is the indicated 2-1000 millimeters. The processed surface of wafer 20 is in directly opposite juxtaposition to the subjacent pool 40.

The processing machine 10 is also advantageously provided with a means for maintaining a homogeneous mixture of the liquid phase constituents. This is suitably provided in the form of a central drain 50 which has a system outflow line 51 through which liquid is drained through drain valve 52 to a disposal line 53. The outflow line 51 is advantageously branched to form a recycle line 55 which empties into a reservoir 60. Reservoir 60 can advantageously be provided with a suitable heater, such as a thermostatically controlled electric resistance heating coil 63 for maintaining the processing liquid at a desired temperature.

Reservoir 60 is provided with an outflow in the form of pump feed line 61 which communicates fluid to the inflow side of a suitable pump 65. Pump 65 and outlet valve 68 are controlled to deliver a supply of the processing liquid to form pool 40 in the lower portions of processing chamber 16. A reservoir recycle control valve 56 is provided to allow control of the level of pool 40.

The processor 10 also advantageously is provided with an ultrasonic agitator 75 of suitable design. Agitator 75 can be activated during the acid processing to enhance vapor formation.

FIG. 1 also shows that the processing chamber 16 is further fitted with a drying gas introduction port 76 which receives nitrogen or other drying gas from drying gas supply line 77. The drying gas can be input into the processing chamber via a plurality of circumferentially spaced ports which are at approximately the same elevation as the wafer or slightly below and oriented to direct the flow of drying gas across the processed wafer surface.

The processor 10 is operated to carry out the described processes. Prior to the etching, the wafer 20 is otherwise suitably processed in a variety of related processing steps dependent on the particular integrated circuit product being produced. The head 12 is loaded with wafer 20 which is held in position by the wafer holder. The head is then positioned in sealing relationship with the bowl 14 or otherwise suitably adjusted to confine the processing chamber against drafts and other substantial leakages which might affect the homogeneous vapor phase which is being presented for contacting and etching the processed surface of wafer 20.

The bowl is thereafter filled with the source liquid for producing the etchant vapor using pump 65, supply line 66 and suitable control of valves 52, 56 and 58. The wafer is preferably rotated at a suitable speed, as indicated, during the filling operation and maintained briefly to better establish an equilibrium condition between the liquid etchant source and the vapor phase etchant gas within the processing chamber adjacent the wafer surface. This equilibrium can typically be established within 10 seconds to 1 minute depending on the size and proximity spacing of the system. The agitator 75 or recycle loop through reservoir 60 can be used to assist in the production of vapor from the liquid phase. Rotation of the wafer at the desired speed is continued to perform the etching. Etching times are commonly in the approximate range 30 seconds to 3 minutes, with 1 minute etching times most typical. Pump 65 and valves 56 and 68 can be suitably controlled to recycle the source liquid to maintain homogeneity and to filter the liquid through recycle filter 67 which is preferably a 0.1 micron or smaller filter to remove particles from the liquid during recycle.

After the etching has suitably been completed then the valve 56 is opened and the pool of etchant source liquid is drained to reservoir 60 for reuse. Alternatively, it can be drained through valve 52 when it is expended. After the pool 40 has been drained the wafer rotational speed can advantageously be increased to speeds typically in the range of approximately 1000-2000 rpm to assist in the removal of any condensed vapor and to minimize the potential for residue. Such post-etching spin processing is typically done for periods of 30 seconds to 2 minutes, or as appropriate. The post-treatment spin can be performed while also passing a flow of drying gas through the chamber using inlet port 76.

After the post-etching spin, the head is removed upwardly and the wafer removed in any suitable manner for subsequent processing.

FIG. 2 shows portions of an alternative processing machine 110 similar to machine 10 described above. The notable difference is in the provision of a perimeter trench 117 in processing bowl 114 for confining the etchant or other processing fluid pool 140 therein about the periphery of the wafer 120. The wafer and supporting wafer holders preferably extend in close proximity to create vapor circulation between the toroid-shaped pool and the processed lower surface of wafer 120. Drain 150 and outflow line 151 are similarly connected to a recycle and drain system such as described above with reference to FIG. 1. The system shown in FIG. 2 is operated using processes the same or similar to that described above.

EXAMPLE

Liquid etchant was prepared by mixing hydrofluoric acid and water in amounts sufficient to provide a molar ratio of approximately 1:20 (hydrofluoric:water). The liquid was then charged into a processing apparatus similar to that described and shown in FIG. 1. The water and acid mixture was then circulated to help assure homogeneity and drained to the reservoir. The liquid mixture was used at room temperature. The wafer was installed in the head of the processor and the head and wafer were positioned for processing. The wafer was spun at approximately 150 rpm while etchant mixture was filled into the processing bowl beneath the spinning wafer. The wafer was spaced approximately 5.7 millimeters from the pool of etchant. After the mixture was sufficiently filled into the bowl, the wafer was processed for approximately 60 seconds. Thereafter the processing chamber was supplied with a flow of nitrogen at ambient conditions and approximately 2 psig pressure for approximately 1 minute to aid in volatilizing any residual etchant vapors from the surface of the wafer. The resulting wafers were examined and found to have good etch uniformity and etch rates suitable for commercial processing.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A process for etching semiconductor wafers using hydrofluoric acid vapor, comprising:
   containing a wafer within a substantially enclosed processing chamber;
   producing a vapor mixture of hydrofluoric acid vapor and water vapor to provide a substantially homogeneous etchant gas; said producing a vapor mixture being accomplished by providing a pool of liquid etchant source comprising a substantially homogeneous mixture of hydrofluoric acid and water within the enclosed processing chamber;
   contacting the substantially homogeneous etchant gas against a processed surface of the wafer which is to be etched;
   spinning the wafer to provide uniform dispersion of the etchant gas across the wafer surface and to facilitate circulation and transfer of the etchant gas to the processed surface;
   enhancing production of said vapor mixture from said pool of liquid etchant source by spinning a member within the enclosed processing chamber to effect circulation of gases therewithin.

2. A process according to claim 1 wherein said spinning the wafer is at rotational speeds in the approximate range of 20-1000 revolutions per minute.

3. A process according to claim 1 wherein said spinning the wafer is at rotational speeds in the approximate range of 30-800 revolutions per minute.

4. A process according to claim 1 wherein said spinning the wafer is at rotational speeds in the approximate range of 50-400 revolutions per minute.

5. A process according to claim 1 wherein said spinning the wafer is at rotational speeds in the approximate range of 50-250 revolutions per minute.

6. A process according to claim 1 wherein said spinning the wafer the wafer is accomplished while orienting the processed surface downwardly in proximity to said liquid etchant source.

7. A process according to claim 6 wherein said wafer is positioned within a proximity range of approximately 2-100 millimeters from the liquid etchant source to portions of the processed surface of the wafer.

8. A process according to claim 6 wherein said spinning the wafer is at rotational speeds in the approximate range of 20-1000 revolutions per minute.

9. A process according to claim 6 wherein said spinning the wafer is at rotational speeds in the approximate range of 30-800 revolutions per minute.

10. A process according to claim 6 wherein said spinning the wafer is at rotational speeds in the approximate range of 50-400 revolutions per minute.

11. A process according to claim 6 wherein said spinning the wafer is at rotational speeds in the approximate range of 50-250 revolutions per minute.

12. A process according to claim 6 wherein said liquid etchant source has an approximate molar ratio of hydrofluoric acid to water in the range of 1:100 to 1:1 (hydrofluoric acid:water).

13. A process according to claim 6 wherein said liquid etchant source has an approximate molar ratio of hydrofluoric acid to water in the range of 1:50 to 1:5 (hydrofluoric acid:water).

14. A process according to claim 6 wherein said liquid etchant source is recirculated and filtered.

15. A process according to claim 1 wherein said providing a pool is accomplished by forming said pool beneath a wafer being processed; and further defined by orienting said processed surface downwardly in proximity to the pool of liquid etchant source.

16. A process according to claim 15 wherein said wafer is positioned within a proximity range of approximately 2-100 millimeters from the liquid etchant source to portions of the processed surface of the wafer.

17. A process according to claim 1 wherein said providing a pool is accomplished by forming a toroidal pool adjacent to a wafer being processed; and further defined by orienting said processed surface downwardly in proximity to the toroidal pool of liquid etchant source.

18. A process according to claim 17 wherein said wafer is positioned within a proximity range of approximately 2-100 millimeters from the liquid etchant source to portions of the processed surface of the wafer.

19. A process for etching semiconductor wafers using vapor, comprising:
containing a wafer within a substantially enclosed processing chamber;
producing a substantially homogeneous vapor mixture of an etchant vapor and a diluent vapor to provide a substantially homogeneous processing gas; said producing a substantially homogeneous vapor mixture being accomplished by providing a pool of liquid processing fluid source within the substantially enclosed processing chamber;
contacting the substantially homogeneous processing gas against a processed surface of the wafer which is to be etched;
spinning the wafer to provide uniform dispersion of the substantially homogeneous processing gas across the wafer surface and to facilitate circulation and transfer of the substantially homogeneous processing gas to the processed surface;
enhancing production of said vapor mixture from said pool of liquid processing fluid source by spinning a member within the enclosed processing chamber to effect circulation of gases therewithin.

20. A process according to claim 19 wherein said spinning the wafer is at rotational speeds in the approximate range of 20-1000 revolutions per minute.

21. A process according to claim 19 wherein said spinning the wafer is at rotational speeds in the approximate range of 30-800 revolutions per minute.

22. A process according to claim 19 wherein said spinning the wafer is at rotational speeds in the approximate range of 50-400 revolutions per minute.

23. A process according to claim 19 wherein said spinning the wafer is at rotational speeds in the approximate range of 50-250 revolutions per minute.

24. A process according to claim 19 wherein said spinning the wafer the wafer is accomplished with said processed surface downwardly in proximity to said liquid processing fluid source.

25. A process according to claim 24 wherein said wafer is positioned within a proximity range of approximately 2-100 millimeters from the liquid processing fluid source to portions of the processed surface of the wafer.

26. A process according to claim 24 wherein said spinning the wafer is at rotational speeds in the approximate range of 20-1000 revolutions per minute.

27. A process according to claim 24 wherein said spinning the wafer is at rotational speeds in the approximate range of 30-800 revolutions per minute.

28. A process according to claim 24 wherein said spinning the wafer is at rotational speeds in the approximate range of 50-400 revolutions per minute.

29. A process according to claim 24 wherein said spinning the wafer is at rotational speeds in the approximate range of 50-250 revolutions per minute.

30. A process according to claim 24 wherein said liquid processing fluid source is recirculated and filtered.

31. A process according to claim 19 wherein said providing a pool is accomplished by forming said pool beneath a wafer being processed; and further defined by orienting the processed surface downwardly in proximity to the pool of liquid processing fluid source.

32. A process according to claim 31 wherein said wafer is positioned within a proximity range of approximately 2-100 millimeters from the liquid processing fluid source to portions of the processed surface of the wafer.

33. A process according to claim 19 wherein said providing a pool is accomplished by forming a toroidal pool adjacent to a wafer being processed; and further defined by orienting said processed surface downwardly in proximity to the toroidal pool of liquid processing fluid source.

34. A process according to claim 33 wherein said wafer is positioned within a proximity range of approximately 2-100 millimeters from the liquid processing fluid source to portions of the processed surface of the wafer.

35. A process according to claim 19 and further comprising agitating the pool of liquid processing fluid source.

36. A process according to claim 19 and further comprising ultrasonically agitating the pool of liquid processing fluid source.

37. A process according to claim 19 and further comprising drying the wafer within the processing chamber.

38. A process according to claim 1 and further comprising agitating the pool of liquid etchant source.

39. A process according to claim 1 and further comprising ultrasonically agitating the pool of liquid etchant source.

40. A process according to claim 1 and further comprising drying the wafer within the processing chamber.

41. A process for vapor processing semiconductor wafers using hydrofluoric acid vapor and water vapor, comprising:
   containing a wafer within a substantially enclosed processing chamber;
   providing a substantially homogeneous liquid source comprising a mixture of liquid hydrofluoric acid and liquid water;
   producing from said liquid source a vapor mixture comprising hydrofluoric acid vapor and water vapor to form a substantially homogeneous reactant gas;
   contacting the substantially homogeneous reactant gas against a processed surface of the wafer;
   orienting the processed surface downwardly in proximity to said liquid source;
   spinning the wafer to provide uniform dispersion of the reactant gas across said processed surface;
   enhancing production of said vapor mixture from said liquid source by spinning a member within the enclosed processing chamber to effect circulation of gases therewithin and against said liquid source.

42. A process according to claim 41 wherein said wafer is positioned within a proximity range of approximately 2-100 millimeters from the liquid source to portions of said processed surface of the wafer.

43. A process according to claim 41 wherein said spinning the wafer is at speeds in the approximate range of 20-1000 revolutions per minute.

44. A process according to claim 41 wherein said spinning the wafer is at speeds in the approximate range of 30-800 revolutions per minute.

45. A process according to claim 41 wherein said spinning the wafer is at speeds in the approximate range of 50-400 revolutions per minute.

46. A process according to claim 41 wherein said spinning the wafer is at speeds in the approximate range of 50-250 revolutions per minute.

47. A process according to claim 41 wherein said substantially homogeneous liquid source has an approximate molar ratio of hydrofluoric acid to water in the range of 1:100 to 1:1 (hydrofluoric acid:water).

48. A process according to claim 41 wherein said substantially homogeneous liquid source has an approximate molar ratio of hydrofluoric acid to water in the range of 1:50 to 1:5 (hydrofluoric acid:water).

49. A process according to claim 41 wherein said substantially homogeneous liquid source is recirculated and filtered.

50. A process according to claim 41 wherein said providing a substantially homogeneous liquid source is accomplished by forming a toroidal pool adjacent to a wafer being processed.

51. A process according to claim 41 and further comprising agitating the liquid source.

52. A process according to claim 41 and further comprising ultrasonically agitating the liquid source.

53. A process according to claim 41 and further comprising drying the wafer within the processing chamber.

54. A process for vapor processing semiconductor wafers using a reactant vapor and a diluent vapor, comprising:
   containing a wafer within a substantially enclosed processing chamber;
   providing a substantially homogeneous liquid source comprising a mixture of liquid reactant and liquid diluent;
   producing from said liquid source a vapor mixture comprising reactant vapor and diluent vapor to form a substantially homogeneous reactant gas;
   contacting the substantially homogeneous reactant gas against a processed surface of the wafer;
   spinning the wafer to provide uniform dispersion of the reactant gas across said processed surface;
   enhancing production of said vapor mixture from said liquid source by spinning a member within the enclosed processing chamber to effect circulation of gases therewithin and against the liquid source.

55. A process according to claim 54 wherein said wafer is positioned within a proximity range of approximately 2-100 millimeters from the liquid source to portions of said processed surface of the wafer.

56. A process according to claim 54 wherein said spinning the wafer is at speeds in the approximate range of 20-1000 revolutions per minute.

57. A process according to claim 54 wherein said spinning the wafer is at speeds in the approximate range of 30-800 revolutions per minute.

58. A process according to claim 54 wherein said spinning the wafer is at speeds in the approximate range of 50-400 revolutions per minute.

59. A process according to claim 54 wherein said spinning the wafer is at speeds in the approximate range of 50-250 revolutions per minute.

60. A process according to claim 54 wherein said substantially homogeneous liquid source is recirculated and filtered.

61. A process according to claim 54 wherein said providing a substantially homogeneous liquid source is accomplished by forming a toroidal pool adjacent to a wafer being processed.

62. A process according to claim 54 and further comprising agitating the pool of liquid etchant source.

63. A process according to claim 54 and further comprising ultrasonically agitating the pool of liquid etchant source.

64. A process according to claim 54 and further comprising drying the wafer within the processing chamber.

65. A process for vapor processing semiconductor wafers, comprising:
   supporting a wafer for processing within a substantially enclosed processing chamber;
   providing liquid source within the substantially enclosed processing chamber to provide a pool of liquid source; said liquid source comprising a substantially homogeneous mixture of liquid hydrofluoric acid and liquid water;

producing a substantially homogeneous vapor mixture within the processing chamber from said liquid source; said vapor mixture comprising hydrofluoric acid vapor and water vapor;

contacting the vapor mixture against at least one processed surface of the wafer being processed;

spinning the wafer in juxtaposition to the pool of liquid source; said wafer being spun at sufficient speeds to mix the vapor mixture and maintain homogeneity thereof and provide uniform dispersion of the vapor mixture across the at least one processed surface of the wafer;

enhancing vapor formation by spinning the wafer in juxtaposition to the pool of liquid source.

66. A process according to claim 65 wherein said spinning the wafer in juxtaposition to the pool of liquid source is accomplished with the wafer within a proximity range of approximately 2-100 millimeters from the pool of liquid source to the wafer.

67. A process according to claim 65 wherein:

said spinning the wafer in juxtaposition to the pool of liquid source is accomplished with the wafer within a proximity range of approximately 2-100 millimeters from the pool of liquid source to the wafer;

said spinning the wafer is at rotational speeds in the approximate range of 20-1000 revolutions per minute.

68. A process according to claim 65 and further comprising circulating liquid source through said pool provided in the processing chamber.

69. A process according to claim 65 and further comprising agitating said pool of liquid source provided in the processing chamber.

70. A process according to claim 65 and further comprising ultrasonically agitating said pool of liquid source provided in the processing chamber.

71. A process according to claim 65 and further comprising drying the wafer within the processing chamber while rotating the wafer.

72. A process according to claim 65 wherein the wafer is rotated in juxtaposition to a toroidal pool of liquid source.

* * * * *